United States Patent [19]

Savit

[11] 4,319,347
[45] Mar. 9, 1982

[54] SEISMIC METHOD AND SYSTEM OF IMPROVED RESOLUTION AND DISCRIMINATION

[75] Inventor: Carl H. Savit, Houston, Tex.

[73] Assignee: Western Geophysical Co. of America, Houston, Tex.

[21] Appl. No.: 77,260

[22] Filed: Sep. 19, 1979

Related U.S. Application Data

[63] Continuation of Ser. No. 879,887, Feb. 21, 1978, which is a continuation of Ser. No. 665,150, Mar. 8, 1976.

[51] Int. Cl.$^3$ .......................... G01V 1/22; G01V 1/36
[52] U.S. Cl. ...................................... 367/52; 367/60; 367/63; 367/74; 367/79
[58] Field of Search ...................... 367/74, 79, 50–52, 367/60, 59, 58, 61–64

[56] References Cited

U.S. PATENT DOCUMENTS

| | | | |
|---|---|---|---|
| 3,346,068 | 10/1967 | Woods et al. | 367/ |
| 3,349,866 | 10/1967 | Mifsud | 367/ |
| 3,363,229 | 1/1968 | Miller, Jr. et al. | 367/ |
| 3,411,145 | 11/1968 | Cragon et al. | 367/60 |
| 3,529,282 | 9/1970 | Brown | 367/ |
| 3,564,494 | 2/1971 | Frasier et al. | 367/ |
| 3,597,727 | 8/1971 | Judson | 367/ |
| 3,719,924 | 3/1973 | Muir | 367/ |
| 3,744,019 | 7/1973 | Schmitt | 367/ |
| 3,766,519 | 10/1973 | Stephenson | 367/ |
| 3,831,136 | 8/1974 | Sagoci | 367/ |
| 3,851,302 | 11/1974 | Schmitt | 367/79 |
| 3,852,708 | 12/1974 | Doolittle | 367/ |
| 3,863,201 | 1/1975 | Briggs | 367/ |
| 3,881,166 | 4/1975 | Fort et al. | 367/ |
| 3,887,897 | 6/1975 | Weitzel | 367/ |
| 3,916,371 | 10/1975 | Broding | 367/ |
| 3,946,357 | 3/1976 | Weinstein et al. | 367/ |
| 3,996,553 | 12/1976 | Sienis et al. | 367/79 |
| 4,042,906 | 8/1977 | Ezell | 367/ |
| 4,202,048 | 5/1980 | Edwards | 367/74 |
| 4,208,732 | 6/1980 | Ruehle | 367/52 |

Primary Examiner—Howard A. Birmiel
Attorney, Agent, or Firm—William A. Knox; Norman E. Brunell

[57] ABSTRACT

A seismic cable assembly has approximately 500 equally spaced elemental sensor units to receive seismic signals generated in the earth by a seismic impulse generator or "shot". The sensor units each include 3 hydrophones or geophones spaced about 6 feet apart, for a sensor unit length of about 12 feet, to receive seismic signals up to several hundred hertz. Signals representing seismic waves received at each of these 500 units are transmitted from the cable, to a central control and recording unit, mounted in a vehicle such as a towing ship. Connected to the cable will be one or more array-forming systems for processing seismic data from the sensor to synthesize various direction-sensitive hydrophone arrays located along the seismic cable. In combining signals from the individual sensor units making up each array, the array-forming apparatus may increase the relative weighting of signals from selected sensor units in each array and/or may vary the delay between signals arriving at different sensors making up an array. The seismic cable incudes 50 sections spaced apart by electronic connector modules which convert the seismic signals fron analog to digital form, and multiplex the signals for transmission over the cable employing a two-level, channel sequential, time sequential multiplexing technique. The array forming systems may selectively simulate various known arrays without changing the physical configuration of the streamer cable.

26 Claims, 13 Drawing Figures

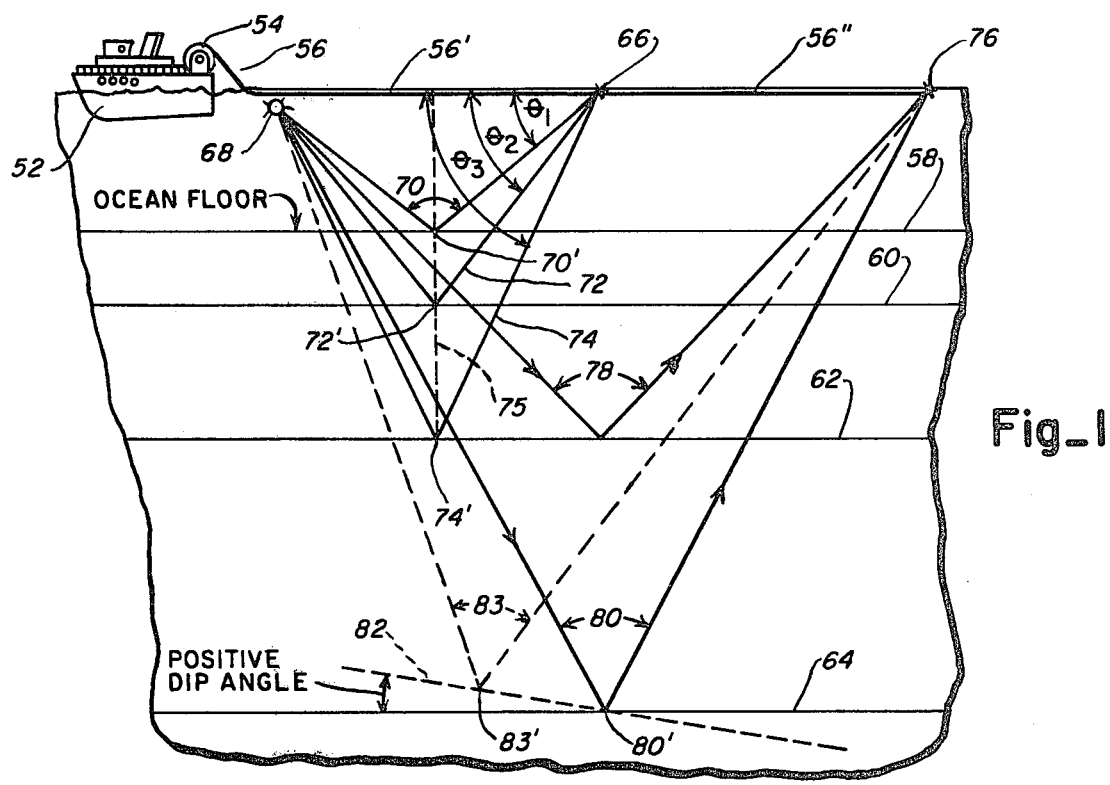
Fig_1
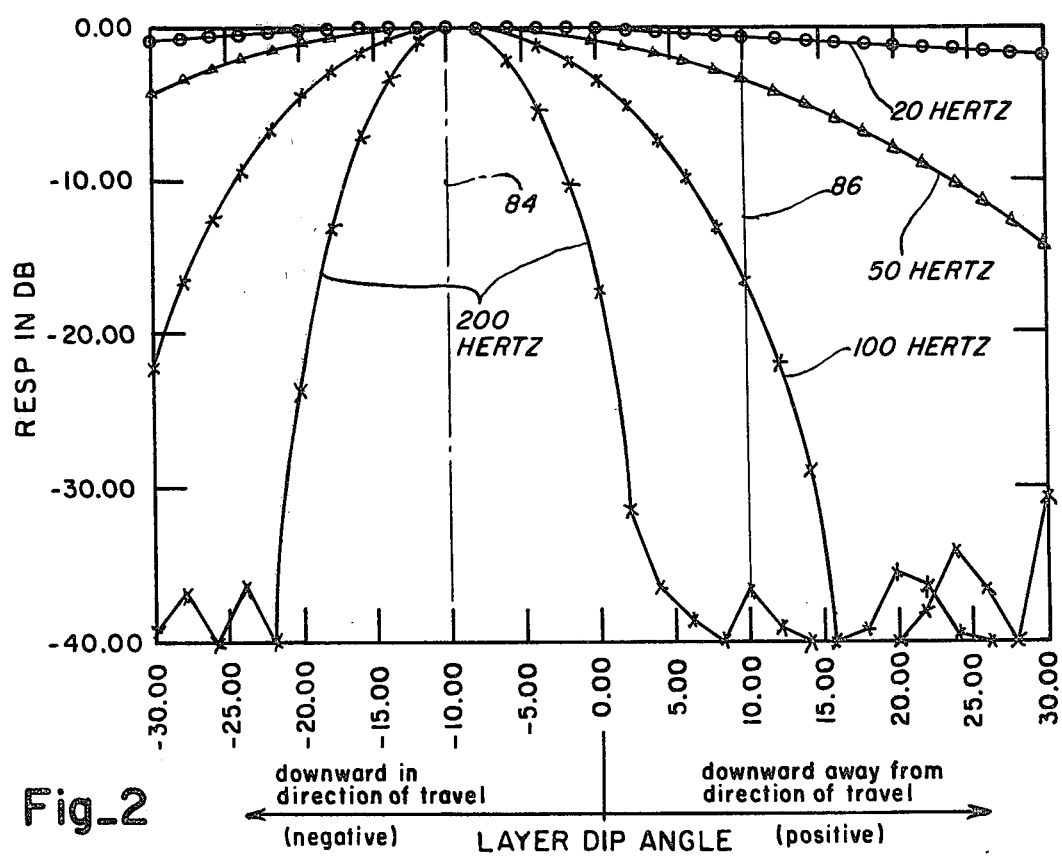
Fig_2

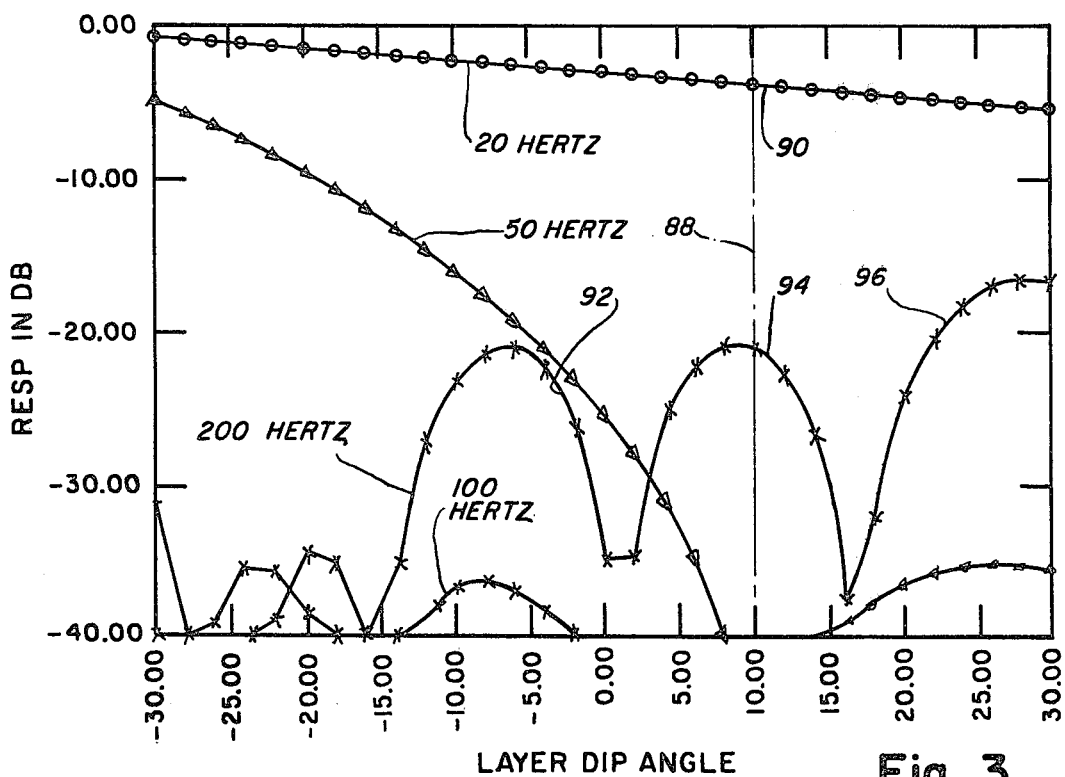
Fig_3
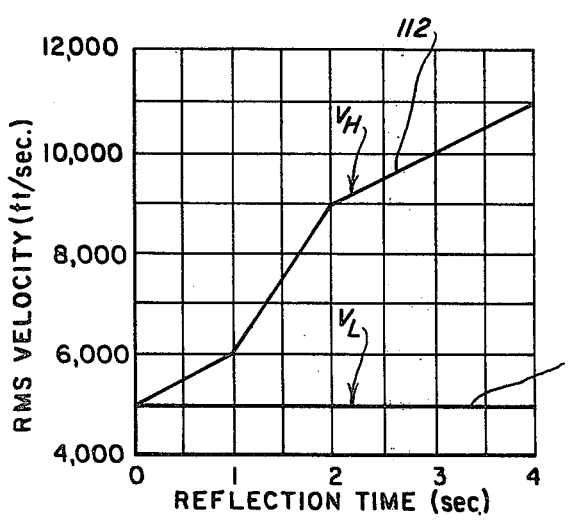
Fig_6
Fig_4
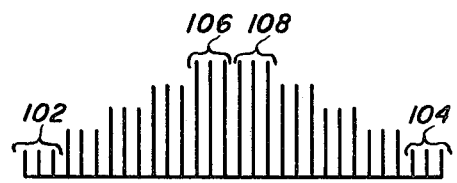
Fig_5

Fig_7
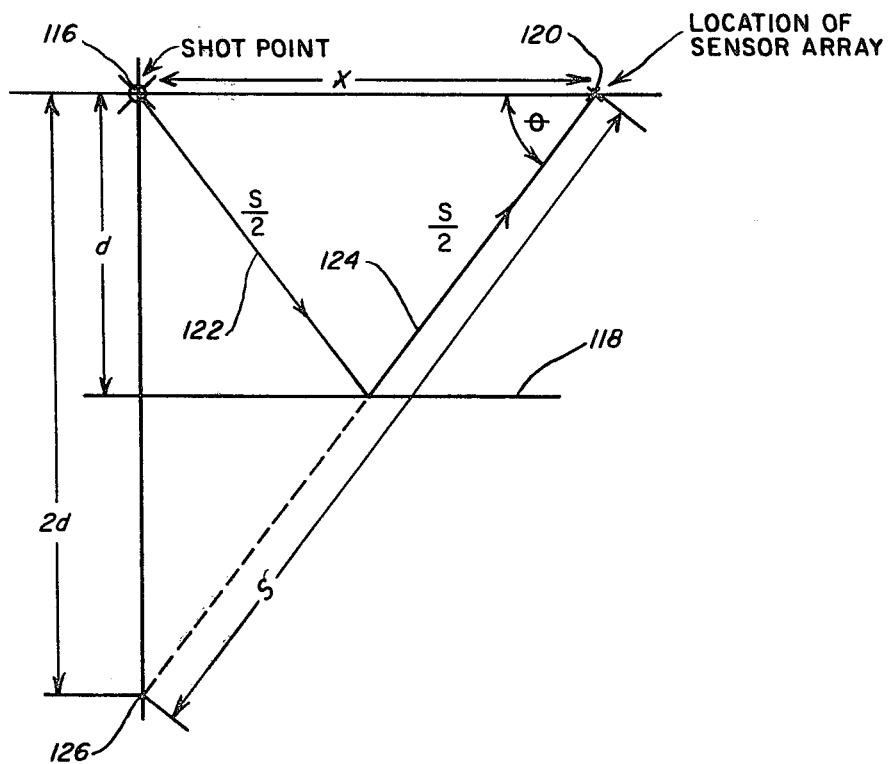
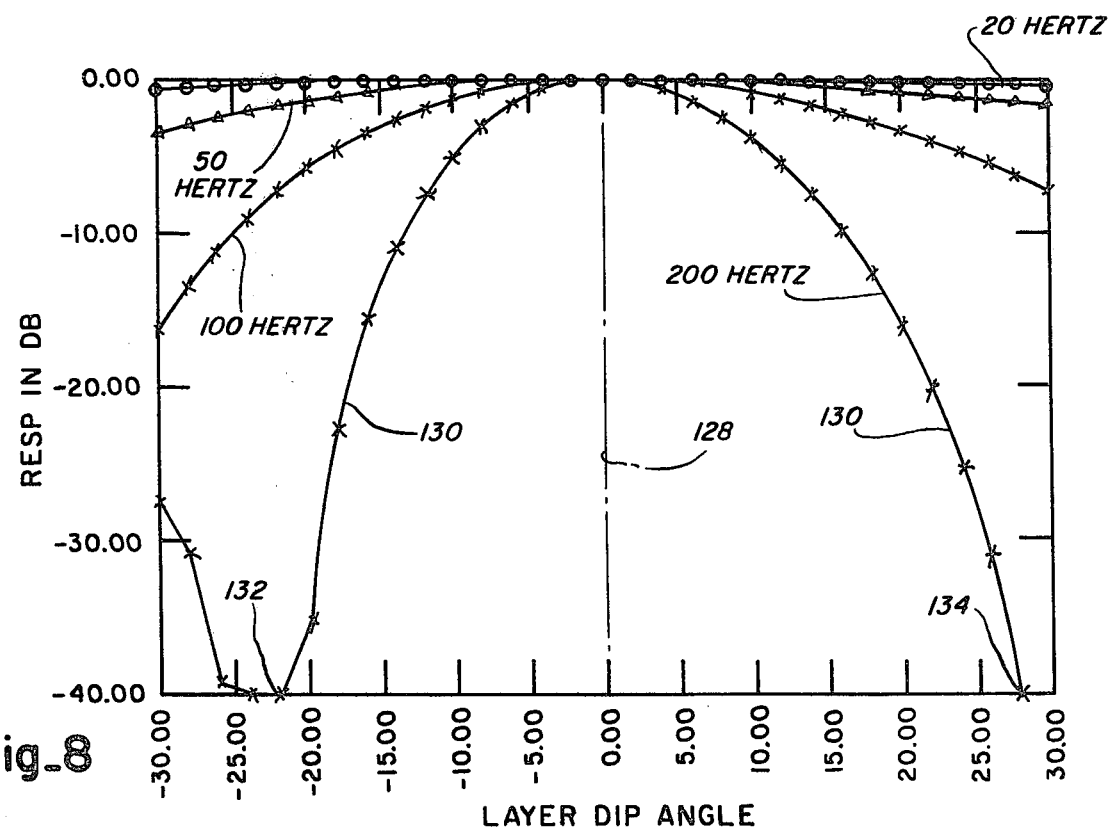
Fig_8

SEISMIC METHOD AND SYSTEM OF IMPROVED RESOLUTION AND DISCRIMINATION

This is a continuation of application Ser. No. 879,887, filed 2-21-78, which is a continuation of Ser. No. 665,150 filed 3-8-76.

CROSS REFERENCES TO RELATED APPLICATIONS

The present case is related to the following patent applications which were filed concurrently with the parent:
1. U.S. Pat. No. 4,031,506 entitled "Multiplexer Commutated High Pass Filter", inventor Lee E. Siems:
2. U.S. Pat. No. 4,031,504 entitled "Gain Ranging Amplifier", inventor George T. Mioduski:
3. U.S. Pat. No. 4,023,140 entitled "Seismic Data Telemetering System", inventor Lee E. Siems, et al:
4. U.S. Pat. No. 4,092,629 entitled "Decentralized Seismic Data Processing System", inventors Lee E. Diems, et al:
5. U.S. Pat. No. 4,005,273, entitled "Multiplexer Offset Removal Circuit", inventor Lee E. Siems; and
6. U.S. Pat. No. 4,072,923 entitled "Multichannel Seismic Telemetering System and Array Former", inventors Lee E. Siems, et al.

Reference is also made to the following co-pending patent applications:
1. U.S. patent applications Ser. No. 446,862 filed Feb. 28, 1974, and now U.S. Pat. No. 3,990,036 entitled "Multiplexer Method and Apparatus for Telemetry of Seismic Data" inventor Carl H. Savit; and
2. U.S. patent application Ser. No. 576,943, filed May 12, 1975 now U.S. Pat. No. 3,996,553 "Seismic Data Telemetering Systems", inventor Lee E. Siems, et al.

BACKGROUND OF THE INVENTION

1. Field of the Invention

This invention relates to acismic methods and systems having improved signal-to-noise ratios and having the capacity for discriminating closely adjacent geological formations or discontinuities and small anomalies, and is particularly applicable to the systematic surveying or exploring of extended geographical areas.

2. Description of the Prior Art

In the well-known reflection method of making seismic surveys, a seismic impulse such as an explosive shot is initiated, and a record is made of impulses received at sensors or detectors at spaced locations along a seismic cable extending from the shot-point. The seismic sensors usually used on land are known as geophones, and those usually used in marine seismic cables are termed hydrophones. The seismic waves from the seismic impulse are reflected back to the surface from interfaces between geologic layers of different properties or characteristics, to the sensors located over the area under survey. The reflected signals received at the sensors are transmitted to recording and processing equipment in a ship or seismic vehicle.

In the course of undertaking a survey of this type for an extended geographical area or prospect, the prospect is covered by a grid of survey lines, and seismic profiles are recorded along these survey lines. In marine work a seismic streamer cable is continuously towed through the water along one of the survey lines, and seismic impulses are initiated from the ship at regular intervals such as every 10 or 20 seconds. On land, the seismic cable is characteristically in the form of a spread of a series of identical sections laid on the ground and connected together by plug-type electrical connectors. The line of survey through the prospect is traversed by firing a seismic shot with the recording and data processing equipment located in a recording truck, connected into the cable. After the shot has been fired and the seismic data have been recorded, one or more of the cable sections are disconnected from one end of the spread, moved, and reconnected to the other end of the spread along the direction of travel. A multiple switch in the recording truck is advanced to a new position thereby advancing the portion of the cable connected to the data processing equipment one or more cable-section lengths along the survey line, whereupon a new recording cycle is undertaken.

Characteristically, in accordance with the prior art, in a 10,000-foot marine streamer cable, approximately 1,500 sensors have been employed. Groups of about 30 of these sensors have been electrically connected, so that seismic signals from typically 48 seismic channels are transmitted from the cable. These reflected signals are recorded and displayed in parallel traces to visually portray subsurface features of the geologic area under survey. In the absence of adjustment, the reflected signals appearing in traces, originating with hydrophone groups remote from the shot-point would be displaced with respect to those in traces originating near the shot-point, and would introduce an apparent variation in depth in the representation of a horizontal reflecting interface. In accordance with known techniques, a moveout or angularity correction is applied to adjust the adjacent traces on the display, so as to present a faithful representation of the reflecting interfaces. The value of the moveout correction is a function of time from the shot, the average seismic-wave velocity in the earth, and the distance between shot point and the detector groups.

In such reflection-type seismic systems which have been developed up to the present time, as noted above, it is conventional to electrically interconnect about 30 geophones or hydrophones into a single group which has a physical extent along the cable from about 100 to 300 feet; one commonly used distance is about 230 feet. With this arrangement, as noted above, at least 48 conductor pairs are employed to transmit the signals from the 48 groups of sensors to the recorder, normally located in the ship or truck used for transporting the seismic equipment.

Usually the frequency response of such known systems is in the very low frequency end of the spectrum, from about 5 to 40 hertz, with the peak response lying below 20 hertz. Among other factors, the lowered high-frequency response is attributable to phase differences of signals arriving at spaced apart points along the length of the groups of electrically-connected sensors which normally extend for a distance of about 230 feet, as mentioned above. To avoid cancellation of signals which are arriving at the various sensors, the length of the electrically connected sensor units or groups preferably should be relatively small as compared with the wavelength of the seismic signals which are being received.

To extend the analysis on a more quantitative basis, a group of electrically-connected seismic sensors disposed on the earth's surface will be considered, the group having a length s. If a seismic wave traveling horizontally along the array is incident at one end of the array, the time T required for the wave to traverse the array is $$T = s/v \qquad (A)$$

where v is the acoustic velocity of the propagating medium adjacent to the array. In water, the acoustic velocity is approximately 5,000 feet per second, hence the transit time T of a horizontally traveling wave in water for a 230-foot group of electrically interconnected sensors would be 0.046 second. For additive reinforcement along the length of the group or unit of sensors, the group length should be less than about one-quarter wavelength. The time for such a seismic wave to travel one wavelength is 0.046×4, or about 0.184 second, which is the period of a wave having a frequency of about 6 hertz, or six cycles per second. Waves traveling along the array and having frequencies substantially greater than the 6-hertz cutoff limit tend to be cancelled. When the length of the group is exactly one-half wavelength, the response of the group is zero since the wave is totally cancelled.

Of course, as is well known, seismic waves may be incident upon a sensor group from many angles. For example, seismic waves reflected from deep geologic formations propagate towards the sensor group in a near-vertical direction. The wave fronts are detected nearly simultaneously by all the detectors in one group; accordingly, in the absence of near surface irregularities such as weathering or elevation differences, the upper cutoff frequency is virtually infinite.

On the other hand, the travel path of seismic waves reflected from very shallow earth layers, whose depth is significantly less than the distance from the shot to the sensor group, approaches the horizontal, so that the foregoing analysis for horizontally traveling waves is applicable. Consider, for example, the relatively flat incident angle of a seismic wave reflected from a layer 1000 feet deep with respect to a sensor group 10,000 feet away from the shot point.

Typically seismic reflections from shallow layers are relatively rich in the high frequencies (100–500 hertz) that are useful for high-resolution analysis of details of geological features. Unfortunately, presently-employed seismic systems, with sensor group lengths of from 100 to 300 feet, are selectively responsive to very low frequencies, with the frequencies below 20 cycles per second predominating; and desired high-frequency waves from shallow earth layers will be cancelled by us of the long sensor groups.

Of course, the emphasis on the lower frequencies in conventional large-area prospecting systems, limits the sensitivity and the power of the system to detect and resolve closely-spaced geological layers, minor discontinuities, or other significant features which may not be extensive in size, particularly in the shallow part of the geological section. Further, now that many of the prospects of principal interest have been surveyed on a reconnaissance basis, it is becoming increasingly important to employ geophysical surveying techniques of high resolution for detail work.

Detector groups of considerable length have been used preferentially in reflection seismic exploration in order to discriminate between signals and unwanted noise. The general theory explaining the relation of array length to the signal-to-noise ratio may be found in the paper *The Moveout Filter* by Savit, Brustad, and Sider, "Geophysics", January 1958.

From time to time, attempts have been made to improve the high-frequency response of seismic arrays by using very short arrays. Unfortunately, the most common result was a considerable degradation of data quality owing to the inevitable decrease in signal-to-noise ratio.

Some exploration seismologists gave preliminary consideration to the possiblity that the final signal-to-noise ratio could be restored to a value comparable to that of arrays in common use by greatly increasing the number of arrays, in effect retaining the number of individual detectors in common use but subdividing them into many more, but shorter, arrays. However, two principal factors combined to render this procedure impractical. The first had to do with processing procedures. In order to determine the normal moveout corrections to be used in assembling data, correlation (or equivalent) processes have to be used among sets of individual seismic traces (data from individual arrays). With data from short arrays, the poor signal-to-noise ratios reduced the effectiveness of this process. Furthermore, the vastly increased number of individual data recordings increased data reduction (processing) costs to levels unacceptable for commercial prospects. Moreover, many other problems and complexities made the implementing of such a system appear to be an insurmountable project.

More specifically, another difficulty resulting from the use of shorter groups of sensors is that, for example, if a full length two-mile seismic cable is to be employed, and if the sensor density is to remain unchanged, the number of signal channels which must be connected to the recorder is increased by an order of magnitude as the group length is reduced. This would mean that about ten times as many conductor pairs would have to be added, if the group lengths were to be significantly reduced. This, of course, would greatly increase the number of contacts required in connector plugs used to couple cable sections made according to previously-proposed techniques. Further, the large number of conductors would greatly increase the weight and the bulk of the cables and decrease their flexibility to unacceptable levels.

Typical prior art systems which are useful in reviewing the background of the present invention include U.S. Pat. No. 3,133,262 of Booth B. Strange, "Dual Seismic Surveying System", granted May 12, 1964, which discloses two overlapping hydrophone spreads in a single marine cable; U.S. Pat. No. Re. 25,204 of Carl H. Becker, "Method of Geophysical Exploration"; C. H. Savit, et al., U.S. Pat. No. 3,096,846, granted July 9, 1963, entitled "Method and Apparatus for Seismographic Exploration", which discloses fixed tapering and weighting of seismic signals from different seismic sensors to provide directivity; J. P. Woods, et al., U.S. Pat. No. 3,346,068, which discloses directionally sensitive seismic transmitting and receiving arrangements; C. E. Welles, U.S. Pat. No. 3,689,873, which discloses some delay and weighting circuits for seismic signals; and, R. G. Quay, U.S. Pat. No. 3,613,071, which shows the use of two arrays or geophones, having different spacing and different sampling rates.

SUMMARY OF THE INVENTION

In accordance with a principal feature of the present invention, a seismic system for the systematic surveying of extensive prospects has been developed which is responsive to significantly higher frequencies than such systems which have been employed heretofore. More specifically, it is contemplated that relatively short elemental hydrophone units shall be employed throughout the full length of a normal size seismic cable. In a specific illustrative embodiment of the cable, only three hydrophones are employed and these are spaced 6.25 feet apart to provide an elemental sensor unit length of approximately 12.5 feet. From equation (A), and if water is assumed to be the medium, the criterion that 12.5 feet is one-quarter of a full wave-length of 50 feet implies that the period of the wave is 0.010 second, corresponding to a limiting frequency of 100 hertz. In the case of a reasonable angle of incidence for shallow reflections of about 60°, the upper frequency limit is 200 hertz. Horizontally traveling noise having a frequency substantially above 100 hertz is attenuated, which is desirable to improve signal-to-noise ratios. Thus, by use of short sensor groups the upper frequency cutoff point has been raised from 6 to 100 hertz for seismic waves propagating nearly horizontally. Of course, with an even shorter sensor group length, an even higher frequency response would be obtained. A 6.5-foot group length raises the response for horizontal propagation to about 200 hertz. With a somewhat longer group length, such as 25 feet, the response would be reduced to 50 hertz, which is, of course, still a great improvement over present commercial prospecting systems.

In accordance with an important aspect of the present invention, the longer array lengths necessary to achieve high signal-to-noise ratios for each of the large number of individual traces making up the cross-section are attained by adding the signals from the required number of elemental sensor units with such time delays as are needed to insure that all the reflection signals which are to be combined into one trace are summed substantially in phase, and these delays are changed during the course of a shot to steer the arrays producing the traces. In effect, the delays render the arriving wave-front parallel to the array, so that the phase velocity of the signal along each sum array is effectively infinite.

Since the dip of subsurface reflecting geological horizons is generally unknown to the seismac surveyor prior to conducting the survey, it will normally be necessary to assume a priori that all reflectors are horizontal and to apply time delays to correspond to those which would apply to a horizontal reflector giving rise to the signal received at each moment in time and at each distance from the shot. To the extent that such programmed time delays do not correspond to the real signal delays, the signals will be summed out of phase. The phase error will, however, normally be much lower than the phase error resulting from the simple, simultaneous summations produced by the fixed arrays of the prior art. Accordingly, the upper limit of the frequency response will be substantially higher.

In accordance with a further aspect of this invention, the individual records of data from the separate detector sets are preserved, so that after a first-cut processing as described above, the array-forming time delays may be reprogrammed and reapplied, as will be described below, to more precisely effectively align the wave-front to be parallel to the horizontal (i.e., parallelism with the array) and thereby achieve a more nearly in-phase sum, which will have a substantially higher high-frequency cutoff point.

The use of shorter group lengths with the full length cable, as required for expeditious prospecting work, raises the problem of transmitting the resultant multiplicity of signals to the recorder, without requiring an unduly bulky, heavy, and expensive cable. In accordance with another aspect of the present invention, electronic means are included within the cable to sample and multiplex the sensor-unit signals from each of the relatively short sensor groups and to send the signals over a single data transmission channel, or over a greatly reduced number of channels, to the recording and processing equipment located at one end of the cable. In accordance with a corollary feature of the present invention, the sampling rate for the multiplexed signals must be more than twice the highest frequency to be transmitted; accordingly, for the preferred embodiment of the present system a sampling rate on the order of at least 500, and preferably 1000 or more samples per second is employed.

In systems such as the present system, where higher frequency seismic signals are employed, certain problems arise which are not encountered, or at least not to the same extent, as at lower frequencies. More specifically, for example, when a geological formation making a substantial dip angle with the horizontal is encountered in a geophysical survey, high-frequency signals of 100 or 200 hertz may be greatly attenuated by the prior art long arrays. Further, a significant difference in amplitude and in frequency content may appear in the received signals from a layer having a substantial dip angle, depending on the direction of deployment of the seismic sensors with respect to the direction of dip, or the orientation of the shot point relative to the seismic array or cable.

This problem has been solved in accordance with one aspect of the present invention, by arrangements which perform the function of continuously steering each of a number of arrays established along the length of a seismic cable, toward the expected direction from which reflected seismic waves will travel during successive intervals of time. In particular, the higher-frequency energy, which is more sensitive to smaller geological discontinuities and formations, will be detected more readily by the directional arrays, and the system will not give disparate results, depending on the direction of traverse along a survey line in an extended survey.

In the light of the foregoing background, a broad aspect of the present invention involves a geophysical method in which at least two arrays of sensor units (hydrophones or geophones) are established in a single seismic cable, and a geophysical survey is undertaken by individually varying the directivity of each of said arrays to selectively receive signals from a seismic disturbance reflected from progressively deeper strata. The array outputs are subsequently processed to produce geophysical cross sections.

In accordance with another broad aspect of the invention, the seismic cable is provided with a large number of generally uniformly spaced elemental sensor units, and signals from each of these units are transmitted from the cable to seismic data-processing apparatus instead of being combined electrically within the cable. As noted above, in known marine cables, about 10,000 feet in length, approximately 1,500 hydrophones are employed and the signals from groups of about 30 of these hydrophones would be combined to form a single channel so that seismic signals from 48 channels would be transmitted from the cable. By way of contrast, the present invention might involve the use of approximately the same number of sensors, but would combine the outputs from only a few sensors to form an elemental sensor-unit signal, and transmit seismic signals representing several hundred of these elemental sensor units from the cable. These seismic signals are combined to produce a lesser number of directional array signals representing adjacent paths through the geological structure toward which the individual arrays are continuously directed. These array signals are subsequently combined to produce a geophysical representation of a cross-section of the earth.

A further aspect of the invention involves the structure of the seismic cable employed in the system described above, and specifically includes a multiplicity of uniformly spaced sensor groups in each of a large plurality of cable sections, with consecutive cable sections being spaced apart by an electronic connector module including an active electronic package for digitizing, multiplexing, and controlling signals transmitted to and from the cable.

In accordance with another feature of the invention, a seismic cable assembly is provided which has a large plurality of short elemental sensor units. Signals from each sensor unit are sampled and multiplexed into a single data transmission channel connected to a recording and storage device. An array-former assembles the stored data to synthesize the response to an array having any desired characteristics.

An additional aspect of the invention includes the use of a high capacity recorder of the video-recorder type to store the digital signals representing seismic signals from all of the multiplicity of elemental sensor units in each of the many lengths of seismic cable. The recorded digital signals are then processed by a second array-former by synthesizing a plurality of direction-sensitive sensor arrays along the line of survey, forming a series of geophysical traces by individually directing said arrays toward the expected reflection points, which change as a function of reflection travel time, after a shot. This technique makes it possible to record more selectively the energy reflected at varying angles from adjacent paths through the geophysical structure being surveyed, to the respective adjacent arrays along the length of the cable. Subsequently, the traces formed from adjacent arrays are combined by means well known in the art to produce a complete geophysical cross section.

In accordance with another aspect of the invention, the initial signals received by the first portion or portions of the seismic cable closest to the shot point may be sampled at a higher rate. At a later stage in the recording cycle from the same shot, when the reflections reach the more distant parts of the cable, the sampling rate for each sensor along the entire cable will be reduced. More specifically, during the initial period, when reflected seismic signals are reaching only sensors in the first half of the cable, each of the sensors in this portion of the cable can be sampled at twice the normal rate, and the sensors in the second half of the cable will not be sampled at all. With this arrangement, the recorder will, of course, be recording the same number of total samples during the entire recording cycle, because during the first portion of the cycle the sensor units on the first half of the cable will be sampled twice during the normal sampling interval, whereas in the later portion of the cycle, all of the units will be sampled once during the normal sampling interval. After a time interval less than that required for reflected signals to reach the second half of the cable, the system will shift to the second mode in which all of the sensors will be sampled at a somewhat slower rate. By way of specific example, if the normal sampling rate for the entire cable is one sample per millisecond, than during the initial interval, the sensors in the first half of the cable could be sampled at a rate of two samples per millisecond, while no sampling from the second, more remote, portion of the seismic cable will take place. The recorder during both portions of the cycle will be receiving samples at a rate equal to the product of 1,000 samples per second times the total number of sensor units in the cable. It is noted in passing that the initial signals received by the near portion of the seismic cable will include higher frequency components because of the relatively short travel paths traversed by the seismic waves, and these higher frequencies may be faithfully recorded by the higher sampling rate. Thus, with samples from the nearer portion of the cable being taken at a rate of 2,000 samples per second instead of 1,000 samples per second, the maximum information which can be transmitted approaches 1,000 cycles per second instead of 500 cycles per second, which is one-half of the lower sampling rate. Accordingly, the higher sampling rate permits even higher definition for selected portions of the geologic section being surveyed.

A particularly important feature of the invention involves the use of ten or more arrays spaced along a cable, with each array including a plurality of elemental sensor units, and combining the signals from the units making up each array with selective delay between the combined signals precisely sufficient to direct the array toward adjacent subsurface points in the area under survey, with the delay between units being different for different arrays, and also varying with time to direct the arrays to receive signals from successively deeper strata. The resultant trace signals may then be combined, employing the usual moveout-correction and display techniques to produce the complete seismic section.

Other aspects of the present invention involve the cable electronics circuitry, with its alternating current power supply operating at a high frequency above the seismic signal band of interest, special amplification, digitizing, and test circuits; and the array-former special data processing circuits, including, for example, the matrix storage arrangements for holding a "time-window" matrix of seismic signal samples, and high-speed arrangements for making a weighted combination of selected samples to form the seismic trace signals from which the survey cross section is prepared.

Now that many of the individual system features have been noted, it is useful to return to certain of the basic objects of the invention and note how the various features contribute toward the achieving of these objects. As noted initially, improvement of the signal-to-noise ratio and increased sensitivity and discrimination of large scale seismic prospects are principal objects of the invention. These objects are achieved in general by increasing the high frequency response of the seismic system. Factors which contribute to the increased high-frequency response include (1) the close spacing of the elemental sensor units, (2) the transmission of a large number (in the order of several hundred) seismic signals from the seismic cable, (3) the combining of elemental seismic unit signals on a continuously variable delay basis to provide directional array signals always pointing to the depth from which the reflected signals are arriving, and (4) providing in-cable electronics to amplify, digitize, multiplex, correct, test and otherwise process the high frequency seismic signals and bring them out of the cable. It is emphasized that all of the foregoing factors, and many others enumerated in the present introduction and specification all play a part and contribute significantly to the complete system disclosed in the present specification.

In summary it is believed that the present disclosed system has approximately doubled the resolution of large scale seismic prospecting systems, by raising the upper limit of the pass band of the seismic system by at least one octave. More specifically, the upper 6 db-down point encountered in large scale seismic systems up to the present has been about 40 hertz, as compared with at least 80 hertz for the system and a method disclosed in this specification.

BRIEF DESCRIPTION OF THE DRAWINGS

Other objects, features and advantages of the invention will become apparent from a consideration of the following detailed description and from a consideration of the drawings in which:

FIG. 1 is a diagram of a marine seismic system employed in describing the present invention;

FIGS. 2 and 3 are diagrams of the response of an unsteered seismic cable array at various frequencies as a function of the dip or tilt of the strata from which signals are reflected;

FIG. 4 is a diagram indicating the configuration of a typical unsteered seismic array which has been used heretofore;

FIG. 5 is a diagram illustrating a tapered array of the type employed in the implementation of certain aspects of the present invention;

FIG. 6 is a plot of an illustrative example of the root mean square (RMS) velocity of seismic waves as a function of the reflection time from the initial "shot" until seismic reflection reaches the sensor;

FIG. 7 is a simplified diagram employed in calculating the delay at adjacent sensor units making up a multi-unit seismic array;

FIG. 8 shows the response of a steerable seismic array as a function of dip angle;

With reference more particularly to the drawings, FIG. 1 is a diagrammatic showing of seismic survey arrangements illustrating certain principles of the present invention. More specifically, FIG. 1 shows a seismic survey or exploration ship 52 with a large cable reel 54 mounted at the stern, and pulling a long marino seismic cable 56, which is unreeled from the reel 54. In FIG. 1, the ocean floor is designated by the horizontal line 58, and various geological strata interfaces are designated by the horizontal lines 60, 62, and 64.

Figure 9:
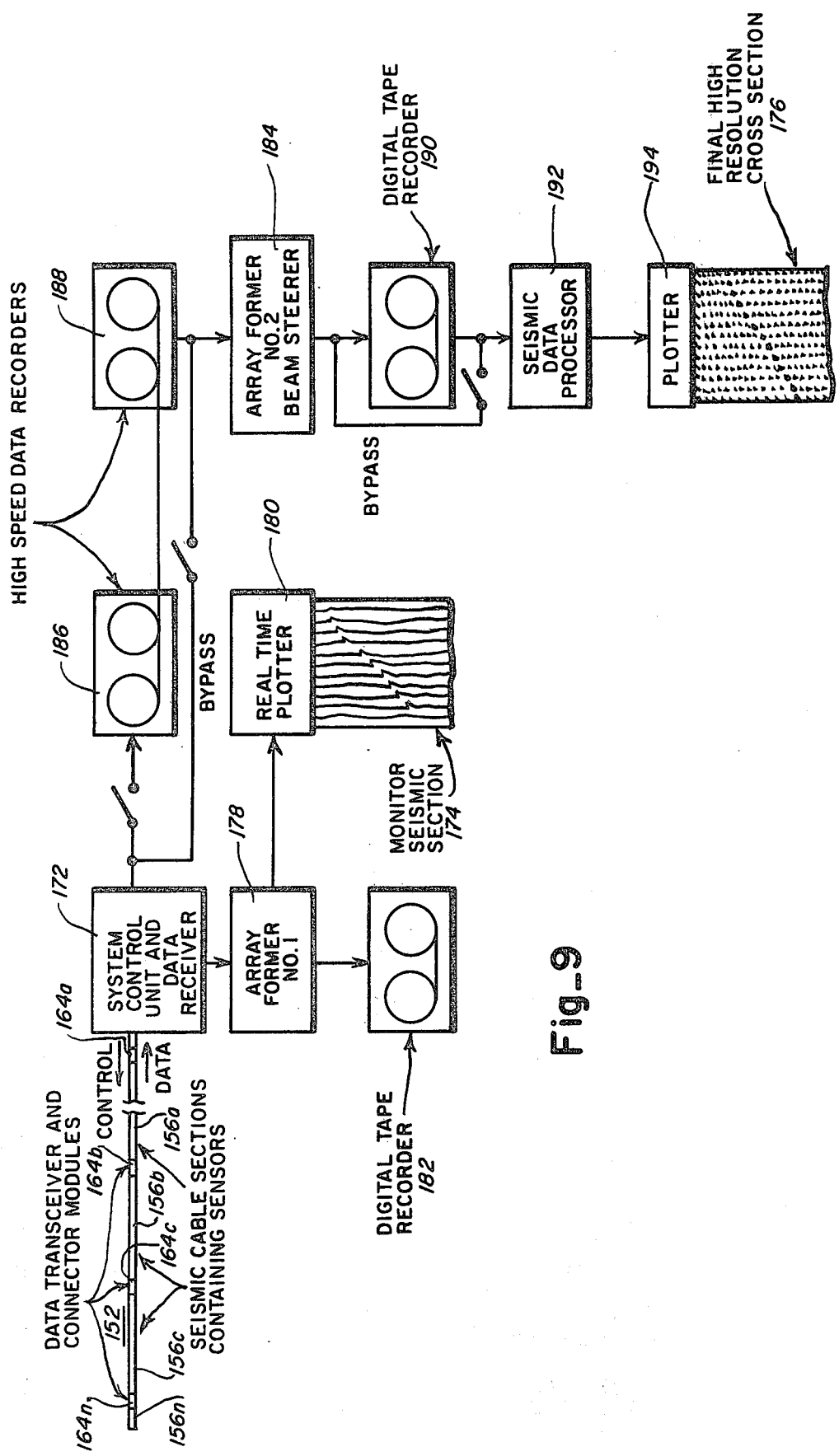
FIG. 9 is a block diagram of an illustrative embodiment of the large scale seismic prospecting system in accordance with the present invention.

The cable 56 has a first section 56' which is located closer to the vessel 52 and a remote section 56" which is farther away from the ship. As is customary in seismic cables, a large number of sensors are embedded in the cable. In accordance with an illustrative embodiment, the cable may be approximately 10,000 feet long and includes 500 sets of elementary sensor units, each including three sensors. With this arrangement, consecutive sensors will be located between six and seven feet apart, preferably 6.25 feet, and each elementary unit, made of three sensors, will extend for approximately $12\frac{1}{2}$ feet, with the center-to-center distance for adjacent sensor units being $18\frac{3}{4}'$ or about 20 feet.

The diagrammatic showing of FIG. 1 brings out certain aspects of the present invention, which will now be considered in greater detail. Initial consideration will be given to the elementary sensor group located at point 66. The sensor group located at point 66 will pick up successive reflections after the shot 68 is detonated near the stern of the vessel and close to the proximate end of the cable 56. Following the initial impulse, known as the "first break", which usually travels directly through the top layer of the water, to the sensor unit 66, the first reflected seismic wave will be that from the ocean floor 58. This initial reflected signal received at sensor unit 66 travels over the relatively short path 70. It may also be noted that the ray 70 as it is incident upon the sensor unit at point 66 makes a relatively shallow angle $\theta_1$ with the horizontal. Subsequent reflections from the geological interfaces 60 and 62 follow paths including the line 72 and 74 respectively. These rays make successively larger angles $\theta_2$ and $\theta_3$ with the horizontal. Accordingly, it may readily be seen that the direction of signals incident upon the sensor unit 66 changes during the course of the recording of seismic reflections and, more specifically, that the angle of received signals relative to the horizontal increases with increased time. Further, the signals reflected along rays 70, 72 and 74 and successively received at sensor unit 66, may, from an over-simplified standpoint, be considered to represent a trace of reflected signals from points along the vertical line 75 including points 70', 72' and 74'.

In FIG. 1, an additional sensor unit 76 located at the remote end of the seismic cable is also shown. For convenience and reference, the inner half of the marine seismic cable is designated by reference numeral 56', and the outer half is designated 56", with sensor unit 76 being located at the outer end of this remote half of the cable 56".

At a later point in time, sensor 76 will pick up reflected signals from geological interface 62 along the path 78; and at a still later point in time, sensor 76 will receive reflections along path 80 from the deep geological interface 64. It may be particularly noted that sensor units 66 and 76 receive signals from any given stratum 62 at different angles and at different times.

Incidentally, it should be mentioned that, as in other types of wave propagation analysis, the waves may be approximately represented by advancing spherical wave fronts or alternatively by rays forming part of said advancing wave front. Further, the ray forms 72 and 74 which are shown straight in FIG. 1 would actually be refracted at the interfaces 58 and 60 at angles which are related to the properties of the strata, in a manner well known in the art.

Of course, strictly horizontal geological interfaces as shown by horizontal lines 58, 60, 62, and 64 in FIG. 1 are uncommon and are not of great interest to the geologist. Of greater interest are geological anomalies, including faults, domes, and other tipping, slanted, or "dipping" geological interfaces. In FIG. 1, the tilted plane 82 is shown making a predetermined dip angle relative to the conventional horizontal plane 64. The dashed line showing a dipping plane 82 is shown to illustrate the subject matter which is dealt with the following FIGS. 2 and 3.

In FIG. 1, attention is further directed to the dashed line seismic ray 83 which meets the dipping plane 82 at point 83'. In the case of a plane which dips downward away from the direction of travel of the ship using the geometry of FIG. 1, the resultant seismic signal picked up at sensor 76 will be reduced as compared with a plane which is tilted or dipped in the opposite direction. This will be developed in greater detail in connection with FIGS. 2, 3, and 8. On a qualitative basis, however, it is noted that conventional seismic arrays are more sensitive to signals arriving at the array vertically and are less sensitive to waves arriving at relatively shallow angles of incidence. Further, this increased sensitivity is more pronounced for conventional seismic arrays at the higher frequencies. As indicated in FIG. 1, the seismic ray 83 arrives at point 76 at a more nearly horizontal angle of incidence than ray 80. Of course, if the plane 82 is dipped in the opposite direction, the angle of incidence at point 76 would be even more nearly vertical and the response would accordingly be increased. This phenomenon will be considered on a more quantitative basis below in connection with the description of FIGS. 2, 3, and 5.

It is noted in passing that reference is made in the present specification to the difference in seismic survey results obtained with one direction of traverse, as compared with the opposite direction of traverse in performing a marine survey. As developed above, this difference is due to the difference in the direction of transmission of the seismic energy, which for marine surveys originates with a seismic impulse from the ship. Of course, with systematic land surveys, the seismic impulse could be initiated from various points including at the rear or the front of a linear cable array along the traverse. In applying the present analysis to land surveys, the location of the seismic impulse source relative to the seismic cable is the determinative factor. FIG. 2 is a plot of the relative response to reflected signals of an unsteered sensor group having the known configuration shown in FIG. 4, located at a distance of 1,000 feet from the shotpoint along cable 56' in FIG. 1 at various indicated frequencies and following a time interval of one second from the shot along the reflected path to the sensor group. The response at 200 hertz is identified by X's: at 100 hertz by +'s: at 50 hertz by triangles: and at 20 hertz by circles. The one second time interval together with the velocity, determines the depth of penetration of the reflected signals. In FIG. 2, the velocity is taken from the high velocity plot of FIG. 5 and is therefore equal to 6,000 feet per second, and the depth of penetration is therefore approximately 3,000 feet. In FIG. 2, the horizontal axis represents the layer dip angle, corresponding to the dip angle between the dashed line 82 and the horizontal line 64 in FIG. 1. With an offset of approximately 1,000 feet from the shot-point, it may be seen that the maximum response at all frequencies occurs at a layer dip angle of approximately $-10°$, which would reflect the seismic waves from the shotpoint substantially vertically toward the sensor array. This condition of maximum response is indicated by the vertical line 84 in FIG. 2.

Most seismic work up to the present has been accomplished at relatively low frequencies for the reasons indicated in FIG. 2. Specifically, note that at the second vertical line 86 in FIG. 2, which corresponds to a positive dip angle of 10°, in the direction shown in FIG. 1, tending to reflect signals toward the pickup sensors at a more nearly horizontal angle of incidence, virtually no energy at 200 cycles per second, or 200 hertz, is picked up by the array.

Note further that along the vertical line 86 the energy received at 100 cycles per second is at a level of approximately $-18$ decibels, and is thus greatly attenuated relative to normal full amplitude represented by the 0 db level at the top of the chart in FIG. 2.

FIG. 3 represents a more extreme condition than that pictured in FIG. 2, for an unsteered array. It involves a distance of approximately 4,000 feet from the shotpoint to the sensor pickup point, a "low" velocity of approximately 5,000 feet per second, characteristic of water or of near-surface materials in some parts of the world, and a time of only one second, corresponding to reflections from a relatively shallow geological layer. As may be seen by reference to the vertical line 88 in FIG. 3, with a dip angle of $+10°$ even the 50 hertz seismic signals are cut off, and only the very low frequencies such as the 20 cycle per second frequencies shown by plot 90 are received by the sensors. Incidentally, certain side lobes for 200 cps are visible at 92, 94, and 96, but these do not provide significant information as they are erratic or distorted in phase and have other anomalies.

The charts of FIGS. 2 and 3 represent in some detail the problems encountered with fixed, unsteered arrays of the type disclosed in some of the references cited above in the present specification.

More specifically, FIG. 4 shows a 26 element array using uniform weighting of the sensor inputs and variable spacing. The overall length of the array is 210 feet, and the spacing is given by the following numerical values: $\pm 3'$, $\pm 8'$, $\pm 14'$, $\pm 19'$, $\pm 25'$, $\pm 30'$, $\pm 38'$, $\pm 44'$, $\pm 52'$, $\pm 61'$, $\pm 71'$, $\pm 80'$, $\pm 105'$, where the 26 elements are spaced from the center of the array by the indicated number of feet.

In FIG. 4, the uniform height of the lines 98 indicates the uniform weight of the sensors, and their horizontal locations indicate the relative spacing of the sensors along the seismic cable. The resultant sensitivity is symmetrical about the vertical, is relatively broad, and discriminates against horizontally traveling waves. The array of FIG. 4 was employed in the preparation of the plots of FIGS. 2 and 3.

The array of FIG. 5 is made up of ten elemental sensor units, each including three sensors. In the tapered array of FIG. 5, the end sensor units 102 and 104 have a weighting of "1", as compared with an increasing weighting of 2, 3, 4, and 5 for the sensor units toward the center of the array, with the two sensor units 106 and 108 near the center having weightings of "5". The array elements are uniformly spaced and extend for a total distance from the first sensor to the last of 203 feet.

This tapered array shown in FIG. 5 has a response with a rather sharply defined principal lobe. As discussed below, the tapered configuration of FIG. 5 may be employed in accordance with the present invention.

FIG. 6 is a plot of velocity in feet per second against reflection time in seconds. In FIG. 6, the low velocity plot 110, also designated $V_L$, appears as a horizontal line indicating a constant velocity of 5,000 feet per second. This is the velocity of seismic waves in water or near the surface of the earth, and is particularly significant for a near horizontally traveling wave in the water. The high velocity plot 112, also designated $V_H$, however, increases in velocity with increasing depth, through the earth (as contrasted with water conditions). Accordingly, with greater reflection times, the root mean square or RMS, velocity in feet per second increases significantly up to a maximum value at a four-second reflection time, of 11,000 feet per second. The high velocity plot is representative of the actual velocity conditions in many parts of the world. Incidentally, the analysis of FIG. 2 is based on the high velocity characteristic $V_H$ of FIG. 6, while FIGS. 3 and 8, representing more extreme conditions, are based on the low velocity plot $V_L$ of FIG. 6.

In accordance with one important aspect of the present invention, a large number of arrays are formed along the length of a seismic cable, and each of these large number of arrays is individually directed so as to be sensitive to seismic reflections reflected from predetermined depths of the geophysical terrain under survey. This may be accomplished by initially transmitting a large number of seismic signals from elemental sensor units, from the cable. Then a large number, perhaps 30, 50, or more arrays are established at 30, 50, or more spaced points along the cable from the signals picked up by the elemental sensor units. These arrays which are spaced along the cable are directed to sense seismic signals from selected depths along adjacent vertical lines of the geophysical area under survey. This directivity may be accomplished by appropriately delaying signals between adjacent elemental sensor units. Subsequently, the seismic signals from adjacent vertical lines are combined to produce a cross section or a composite geophysical survey of the terrain under study.

In providing the proper amount of delay between signals from adjacent elemental sensor units forming an array, it is important to determine the differences in time of arrival of seismic signals to the adjacent elemental sensor units. FIG. 7 and the following mathematical analysis indicate how this delay may be calculated. FIG. 7 is similar to the showing of FIG. 1. In FIG. 7, a seismic impulse from the shotpoint 116 is reflected from the geological boundary 118 to the sensor array 120 designated "X", with the seismic signals traveling along the ray paths 122 and 124.

In the following mathematical analysis relating to FIG. 7, the letters "s", "x", and "d" refer to the distances and points shown in FIG. 7. For convenience of analysis, the point 116 is reflected to point 126 which would be the virtual image of point 116 relative to the plane 118.

For purposes of mathematical analysis, the following definitions shall obtain:
x: Distance of sensor array from shotpoint
v: Velocity of propagation of seismic wave
d: Depth of reflecting layer
s: Length of path of reflected signal
t: Time of transmission of reflected seismic wave along path
$t_o$: Time of transmission of reflected vertical seismic wave over distance $2d$ In general, $$s = vt \quad (1)$$

In the geometry of FIG. 7, $$s = \sqrt{x^2 + 4d^2} \quad (2)$$

$$s = vt = \sqrt{x^2 + v^2 t_o^2} \quad (3)$$

From the square of this equation it is seen that t and $t_o$ are related by the following expression:

$$v^2 t^2 = x^2 + v^2 t_o^2 \quad (4)$$

or $$v^2 t_o^2 = v^2 t^2 - x^2 \quad (5)$$

Now, from equation (3), $$t = \sqrt{\left(\frac{x}{v}\right)^2 + t_o^2} \quad (6)$$

and the derivative $$\frac{dt}{dx} = \frac{x}{v\sqrt{x^2 + v^2 t_o^2}} \quad (7)$$

Now substituting from equation (5) into equation (7) yields:

$$\frac{dt}{dx} = \frac{x}{v\sqrt{x^2 + v^2 t^2 - x^2}} = \frac{x}{v^2 t} \quad (8)$$

If we assume:
x = 6,000 feet,
v = 7,000 feet/sec,
t = 1,000 sec. and an elemental phone unit spacing dx = 20 feet, we can solve for dt as follows:

$$dt = dx \frac{x}{v^2 t} = 20 \frac{6.000}{(7.000)^2 (1.000)} \quad (9)$$

= 2.45 milliseconds which represents the desired delay between elemental sensor units spaced 20 feet apart, required in order that the seismic signals at time t arrive at adjacent units in an array simultaneously.

The angle $\theta$ in FIG. 7 at time t = 1,000 sec is equal to $$\theta = \cos^{-1} s/x = \cos^{-1} vt/x = \cos^{-1} 6/7 = 31° \quad (10)$$

Of course, as the time t increases, reflections will come from deeper strata, $\theta$ will increase, and the required delay between elements of the array located at point x will decrease for maximum response and maximum signal-to-noise ratio.

FIG. 8 is a plot of response vorsus dip angle which is useful for comparison with FIGS. 2 and 3. For FIG. 8 the individual arrays having a highly directional configuration of the type shown in FIG. 5 are located along the length of the seismic cable and are directed to receive energy reflected from a horizontal plane at the depth corresponding to the elapsed time from the time of the shot to the reception of seismic reflections. Thus, for example, with reference to FIG. 1, this would correspond to directing the array located at point 66 to receive maximum energy from layer 58 along 70; at a slightly later point in time the array 66 would be directed downwardly to receive energy from interface 60 along line 72. This change in direction could be accomplished, by way of specific example, by changing the delay between the various elemental sensor units making up the array at the location 66 along the cable.

FIG. 8 represents the response of a steerable array centered at a point located 4,000 feet from the shotpoint, and "looking" in a direction corresponding to an elapsed time for the arrival of reflected seismic signals equal to 1.000 second. It is based on the low velocity plot 110, or $V_L$ of FIG. 6, and is thus fully comparable with FIG. 3. In FIG. 8, as in FIGS. 2 and 3, the response at 200 hertz is identified by x's; at 100 hertz by +'s; at 50 hertz by triangles; and at 20 hertz by circles. At each instant in time, the array is directed to receive energy from a horizontal geological layer located at the proper depth to produce relfected signals at the sensor units. Accordingly unlike the arrangement of FIGS. 2 and 3, the plot of FIG. 8 shows maximum response at all frquencies at a dip angle of 0°, corresponding to the central line 128 in FIG. 8. Note further that the response at each frequency, including the plot 130 of the highest frequency, 200 cps, is substantially symmetrical about line 128. Thus, for negative dip angles, the 200 cps response curve hits −40 db at about 22° as indicated by point 132; and for positive dip angles the intercept is about 28° as indicated by point 134. Further, the loss of 100 hertz signals at dip angles of ±15° is less than 3 db, and the loss of 50 cycle signals is in the order of one or two decibels. This is in dramatic contrast to the plots of FIG. 3, in which no useful information is obtained at the 50 hertz, 100 hertz, or 200 hertz frequency levels, at the +15° dip angle.

It may also be noted that arrangements employing individually and continuously variable directed arrays along the length of the seismic cable have the additional advantage of not being sensitive to the direction of traverse to any significant extent. More specifically, if a seismic traverse were being made from east to west, for example, using a system having the response of FIGS. 2 or 3, a significantly different result would obtain, as compared with the same system used in a traverse from west to east. However, using a system having the response characteristics of FIG. 8, no significant discrepancies would be observed in seismic traverses taken in opposite directions.

Now that the broad principles of the invention have been outlined and some of the advantages of the novel method and system to be described have been considered, an illustrative embodiment of the new seismic system and method will be considered in detail.

FIG., 9 is a block diagram of an illustrative embodiment of the invention. In FIG. 9, the cable 152 includes a large number of cable sections 156a, 156b, 156c . . . 156n. These cable sections are interconnected by electronic modules 164a, 164b, 164c . . . 164n. The details of the cable and the cable electronics are disclosed in greater detail in the various related patent applications filed concurrently herewith and cited above.

In FIG. 9, the cable assembly 152 may be disposed in water in the course of a marine survey, as indicated in FIG. 1 of the present application, or, in the case of a land cable, it is spread out over the terrain to be surveyed with the seismic sensors or geophones lying on the surface of the earth.

The remainder of the system shown in FIG. 9 in block diagram form is located at a central station in a ship or a truck, for example, or in some cases certain of the operations indicated in FIG. 9 are accomplished at a central processing point remote from the seismic survey. As shown in FIG. 9, the output from the cable is routed to the data receiver and system control unit 172, and the seismic data received from the cable at the unit 172 may be processed to give both a monitor seismic section 174 for examination by the survey crew, and to produce a final high resolution cross section 176 for study by geologists. Seismic data from the control unit 172 is transmitted to a first array former 178 and to a conventional monitor seismic section plotter 180. The output from the array former 178 may also be recorded on cinventional digital tape recorder 182.

The monitor seismic sections provided by the plotter 180 generally conform to those presently obtained in the field using various different seismic cables. In accordance with one aspect of the present invention, various type of surveys which have previously been accomplished by substituting one cable for another, may now be realized through the use of the special cable and the special control circuitry 172 and array forming circuits 178 without the need for physically changing the two-mile long seismic cable.

The output from the control unit 172 is also applied to the second array former 184 which is also referred to as the beam steerer. If desired, the beam steerer 184 may be operated directly from the control unit 172. However, it is contemplated that it will often be desirable to merely record the seismic information from control unit 172 on the high speed, high density recorder 186 and later apply it to the beam steerer 184 through the use of the additional tape apparatus 188. Recorders 186 and 188 may, for example, be RCA Versabit video recorders. The output from the beam steerer 184 may be applied to the conventional digital tape recorder 190 and may be applied to a normal seismic data processor 192 to produce the final high resolution cross section 176 by the use of a conventional seismic plotter 194. Normal moveout correction for the array signals may be accomplished by processor 192. Alternatively, normal moveout correction may be accomplished within beam steerer 184, see below.

Figure 10:
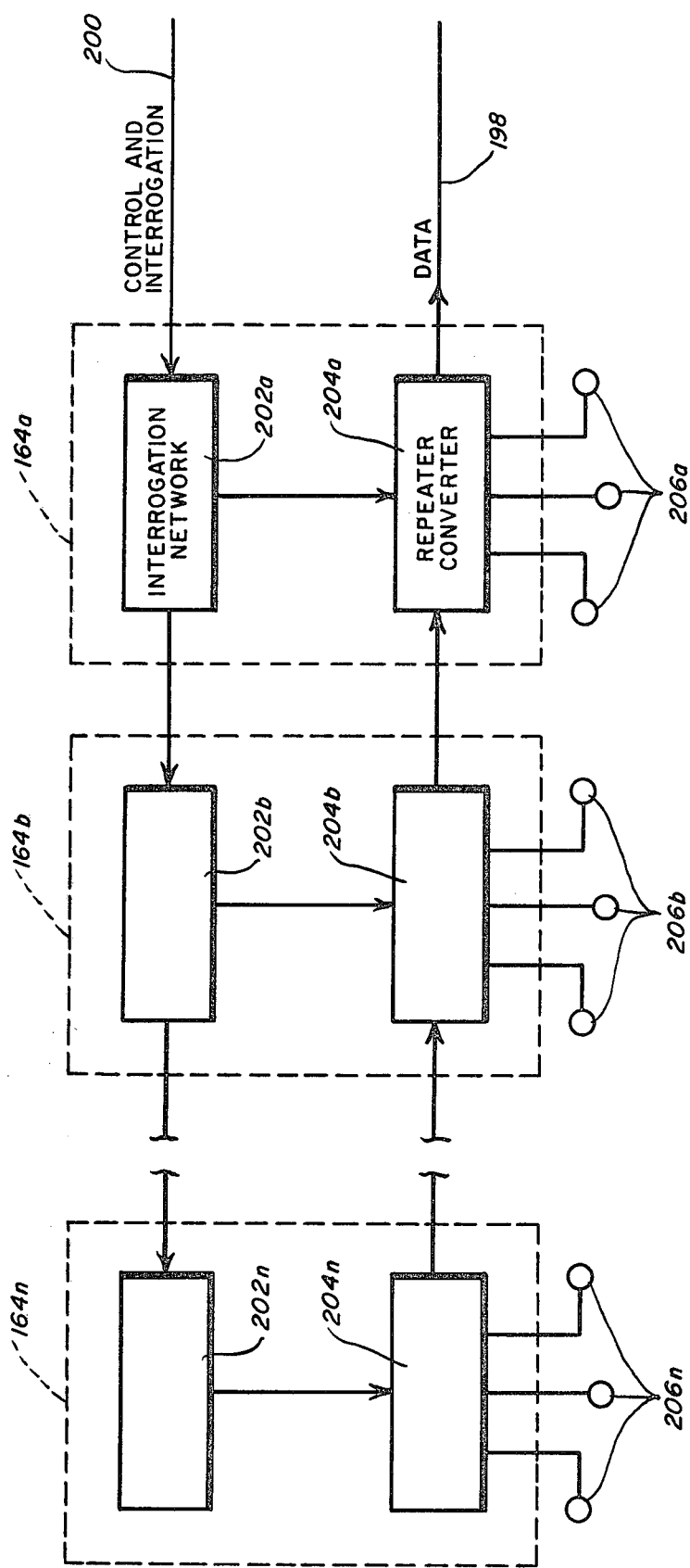
FIG. 10 is a block diagram of the cable electronics and the seismic sensor units which are employed in an illustrative embodiment of the invention.

As disclosed and discussed in greater detail in the above-cited applications, particularly the cases entitled "Decentralized Seismic Data Processing System" U.S. Pat. No. 4,092,629, and "Multi-Channel Seismic Telemetering System and Array Former" (U.S. Pat. No. 4,072,923 ), the cable 152 of FIG. 9 may include, as shown in FIG. 10, a series of data transceiver and connector modules or units 164a, 164b, 164c . . . 164n.

Connecting the control unit 172 (FIG. 9) to the transceiver units 164 are two broadband transmission links, the first being the data link 198 and the second being the control and interrogation link 200. As shown in FIG. 10, included in each transceiver unit 164 is an interrogation network 202 and a repeater network 204.

As mentioned above, the fifty cable sections 156a, 156b, 156c . . . 156n of FIG. 9 have disposed uniformly along their length a series of sensors, with each set of three sensors being interconnected to form a sensor unit. Three of the ten sensor units associated with each cable section are shown in FIG. 10 by the circles 206a, 206b . . . 206n. Analog seismic signals from each of the sensor units 206 are converted to digital form in the repeater, coverter, circuit 204 in the transceiver unit 164 and are applied in multiplex form to the broadband transmission link 198. The timing of the transmission of the multiplex signals is controlled by interrogation signals applied on transmission link 200 to the interrogation network 202, as more fully described in the above-cited applications.

Figure 11:
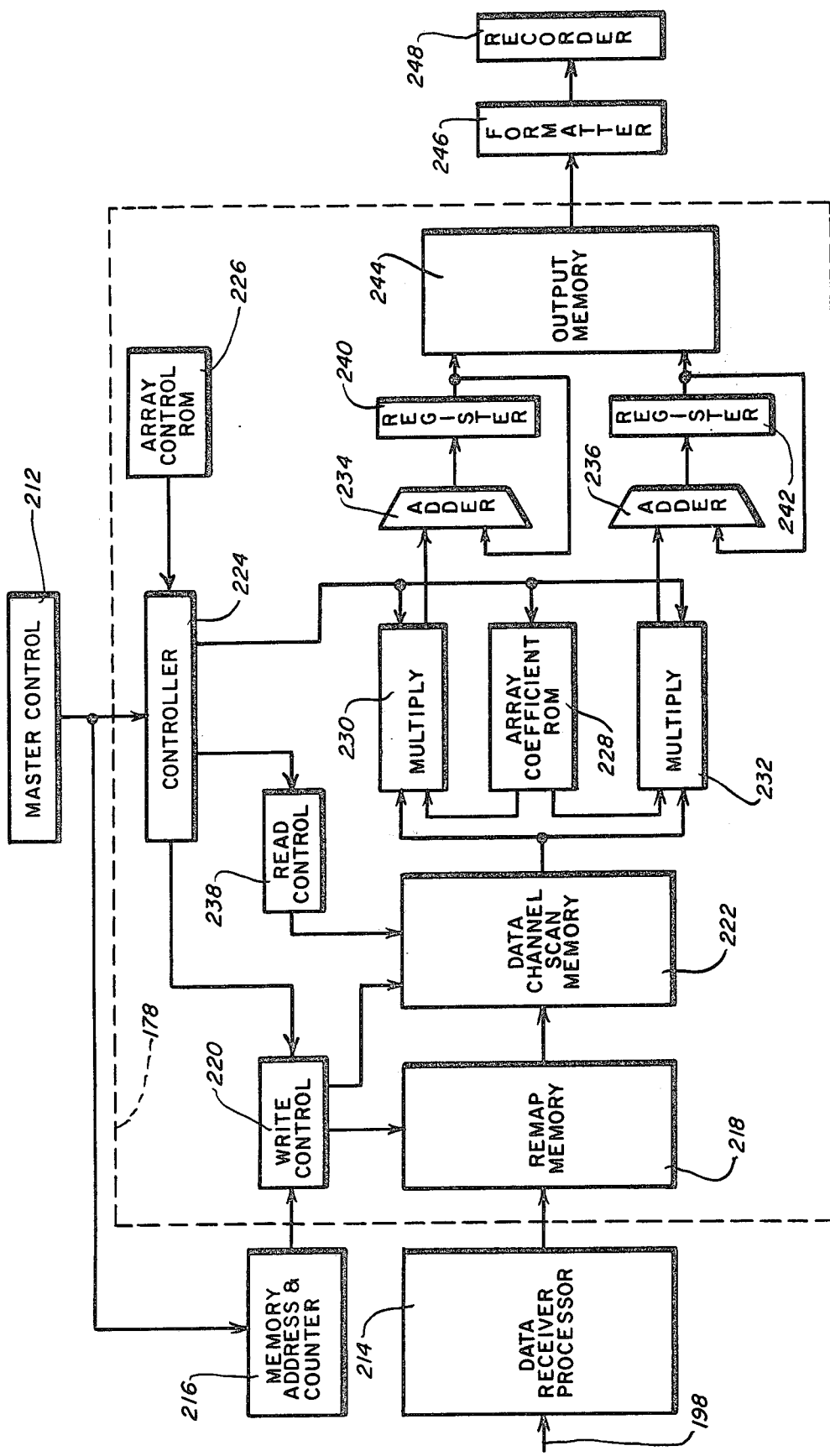
FIG. 11 is a detailed block diagram of an array former which forms part of the circuit of FIG. 9.
Figure 13:
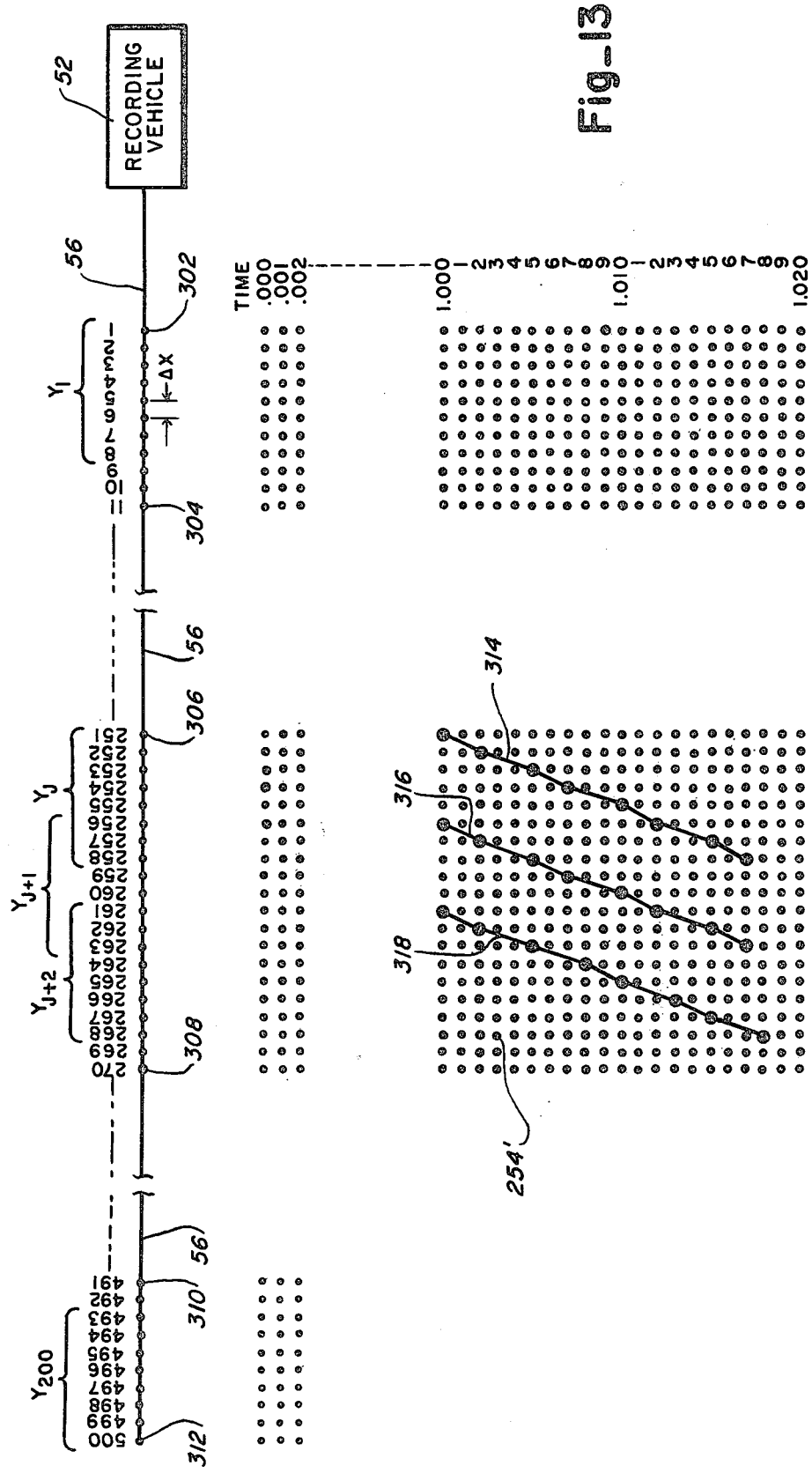
FIG. 13 is a diagram illustrating the formation of arrays in the beam steerer of FIGS. 9 and 12.

FIG. 11 shows a portion of the block diagram of FIG. 9 in much greater detail. In FIG. 11, the array former 178 is enclosed within the large block outlined with dashed lines bearing the same number. The system control unit 172 of FIG. 9 is implemented in FIG. 11 by the blocks 212 and 214. Data from the transmission link 198 of cable 56 is received in the data receiver and processor 214 which applies the information to the array former 178 under the control of master controller 212. Receiver and processor 214 converts the transmitted seismic digital data words from data channel 198 into binary numbers and reformats them into fixed point binary numbers suitable for processing in the digital array former 178. Simultaneously with the receipt of data information at receiver 214, a memory address and time control circuit 216 is set into operation to identifiy the originating seismic sensor unit location and number and associate it with the received seismic information. The seismic data from processor 214 is applied to the remap memory 218 where it is rearranged written in data channel sequence in accordance with instructions from the write control circuit 220. From the remap memory 218, the seismic information is transmitted to the data channel scan memory 222. The data channels are numbered from 1 to 500 starting with the sensor unit 206a closest to the system control unit and ending with the most remote seismic sensor unit 206n (see FIG. 10). This sensor unit numbering scheme is also shown in FIG. 13. The remapping step is employed to accommodate the different sequence of application of seismic channel signals to the data link 198, as disclosed in more detail in the above-cited patent applications. The detailed internal control of the array former 178 is provided by control unit 224. Associated with controlled 224 is the array control read-only memory 226. Information with regard to the desired array combinations of the seismic signals from the 500 sensor units is entered into the control read-only memory 226. This array information may, for example, establish an array such as that shown in FIG. 5 of the present drawings. This would be a ton-element array with tapered weighting coefficients, as described above. Incidentally, the desired array weighting coefficients are entered into the array former 178, specifically into the read-only memory 228.

In forming the combinations of seismic values needed to form the weighted arrays, the data stored in memory 222 is weighted in accordance with the coefficients stored in the read-only memory 228 in multipliers 230 and 232, and the elements of each array are thereafter added in adders 234 and 236. Of course, a read control circuit 238 is provided for timely outputting of the seismic data from memory 222. The sums of the seismic data making up each array are stored temporarily in registers 240 and 242. Incidentally, the dual channels including the multiplier 230, the adder 214 and the register 240, and the multiplier 232, the adder 236 and register 242 are employed to accommodate overlapping arrays including the use of seismic data from a single sensor in two different arrays, with optional different weighting of seismic information from a single channel as it is used in different arrays. From the output registers 240 and 242, the array signals are stored in the output memory 244 from which they are applied to the formatter 246 and the recording 248. Of course, as indicated in FIG. 9, a real time plotter 180 may be connected to the output of the formatter 246; alternatively, the plotter 180 may be operated from tapes of data recorded at 248.

With reference to FIG. 9, the beam steering array former 184 is similar in certain respects to the array former of FIG. 11, but also includes the significant additional capacity of selecting array elements from different times of arrival at the various sensor units.

Figure 12:
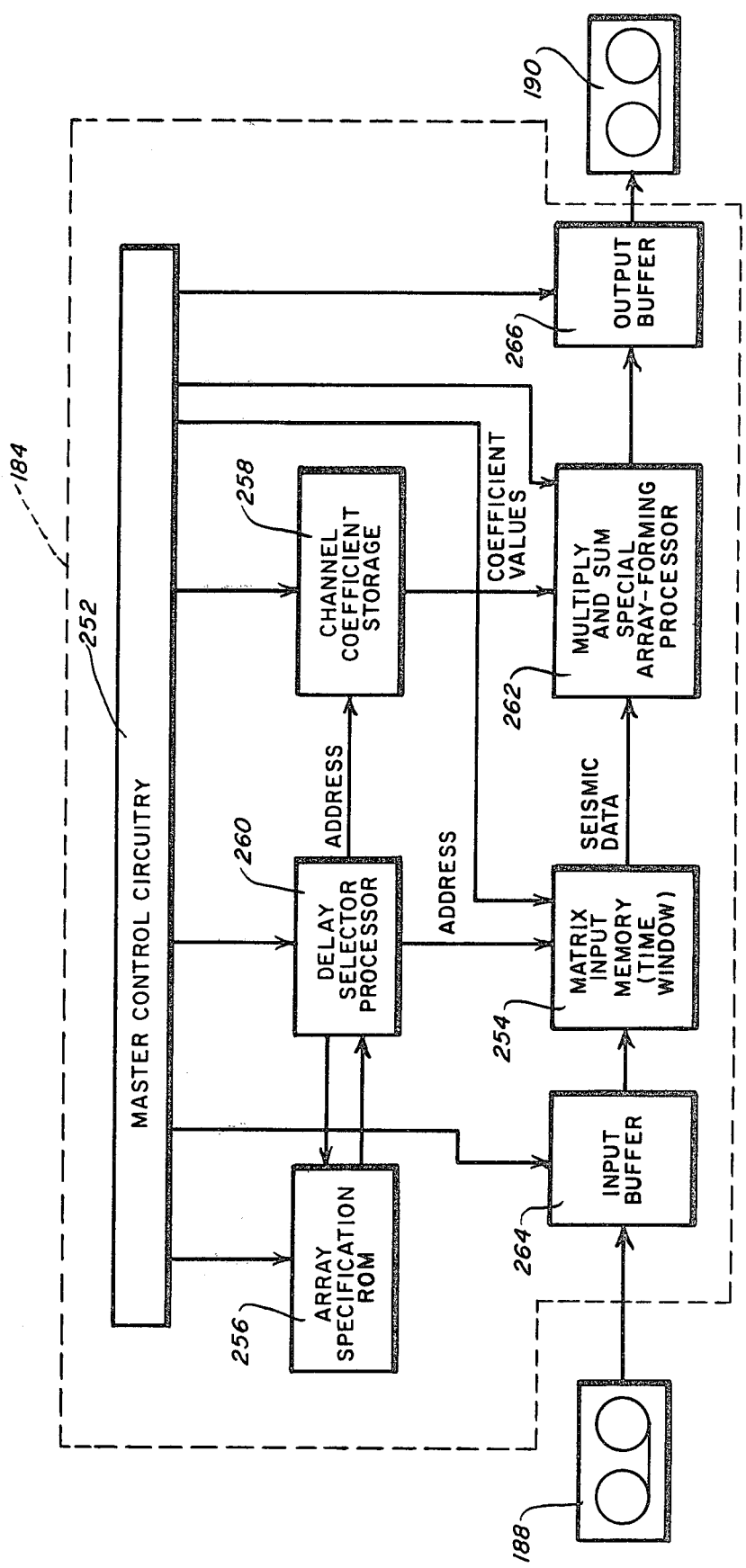
FIG. 12 is an overall block diagram of the special purpose data processing equipment employed in the implementation of the beam steering array former, in accordance with the present invention.

Array former No. 2 is shown in functional block form in FIG. 12 and its operation will be described further in connection with the diagram of FIG. 13. In FIG. 12, the high speed, high density recorder 188 is shown at the far left and the master control circuitry block 252 controls all of the functions in the beam steerer. Within the beam steerer 184, the high capacity of the matrix input memory 254 constitutes one of the significant differences from the array former 178. Instead of a memory storing a single value of the seismic data from each of the 500 channels, the matrix memory 254 stores data words representing 128 values of seismic information from each of the 500 channels. The memory 254 may, for example, be implemented by a core memory. The beam steerer 184 of FIG. 12 also includes the array specification read-only memory 256, the channel coefficient storage memory 258, the delay selector and processor 260 and the special data processing circuitry 262. In addition, the array former includes the input and output buffer circuits 264 and 266.

In operation, the array former of FIG. 12 selectively combines a large number of seismic input signals to form arrays which are continually changing in their direction of maximum signal reception. This change in direction is to accommodate the changes in the angle the to discussed in connection with FIG. 1, as signals are reflected from successively deeper points along the seismic section corresponding generally to the line 75 in FIG. 1. To steer the arrays, the delays among the individual channels of seismic information which are being combined must be changed, as successive complete cycles of forming array outputs are completed during successive one millisecond periods. This is accomplished by the delay selector 260 which provides address information to the large scale memory 254 to output from the core memory seismic information from each channel, properly delayed with respect to seismic data from adjacent channels.

The nature of the operation of the beam steerer will now be considered from certain other aspects to more clearly bring out its mode of operation.

With reference to FIG. 13, an example is given in which a recording vehicle 52 is shown to the right and in which the cable 56 extends to the left. In FIG. 13, the 500 sensor units (each including three spaced sensors) located along the length of the cable are shown by numbered dots located along cable 56. The first eight sensor units included in the first cable section are shown in FIG. 13 as extending from point 302 to point 304; sensor units Nos. 251 through 270 are shown extended from point 306 to point 308 and the final sensor units Nos. 491 through 500 are shown extending from point 310 to point 312. Each of the dots shown in FIG. 13 in the matrix 254' represents a multi-digit binary number stored in the large scale memory 254 of FIG. 12. In array 254' of FIG. 13, data received from specific channels is located below the associated numbered sensor unit, and the data received in successive one millisecond time intervals from a specific channel are located along a vertical line, with the time intervals being indicated at the right in FIG. 13. During each one millisecond time interval, the entire 500 channels corresponding to the 500 sensor units along the cable are sampled and the resultant seismic data is stored in memory 254. As the time cycle progressers, old data is deleted from memory 254 and now up-to-date information is inserted in a scrolling processing as a function of the time interval. However, a time "window" or time frame interval of 128 milliseconds, or 128 samples from each of the 500 sensor units is stored in memory 254. This permits the combination in array former 184 of seismic data from sensor units to be included in an array, with the permissible displacement in time of reception of the samples being up to 128 milliseconds.

To give a specific example of how the system of FIG. 12 works in the practice, the diagram of FIG. 13 identifies the memory location for three overlapping arrays by the lines 314, 316, and 318 which extend diagonally across the memory representation area designated 254' in FIG. 12. Each of these arrays includes signals from eight sensor units (each including three sensors) as shown in FIG. 5.

The example is based on distance x (see FIG. 7) corresponding to the 251st sensor unit, which is located at a distance of 6,000 feet from the shotpoint, normally adjacent one end of the cable. In addition, the time t is assumed to be equal to one second, and a seismic velocity of 7,000 feet per second is assumed. The spacing between sensor units delta x, or dx, is equal to 20 feet in the present example. Substituting into formula (9), dt turns out to be 2.45 milliseconds. This is the desired delay between seismic signals originating at adjacent sensor units spaced 20 feet apart to be included in the array. In its implementation as seen with reference to line 314 in FIG. 12, the first sample from sensor unit 251 is taken at time t equal 1.000 second. The second array signal is taken from sensor unit 252 at time t equals 1.002 seconds. Similarly, the third sample from sensor unit 253 is taken at time t equals 1.005 seconds. The remaining eight units are sampled as shown by the dots along line 314 up to channel 258 which is sampled at time t equals 1.017 seconds. These selected delays, of course, approximate the desired 2.45 milliseconds per channel and result in the in-phase summation of the reflected seismic signals.

In FIG. 13, lines 16 and 318 represent overlapping arrays. More specifically, the array indicated by line 316 includes elemental sensor units 256 through 262, and the array represented by line 318 includes sensor units 261 through 268. The array represented by line 316 starts at a distance of 6,100 feet from the shot point, and the array represented by line 318 starts at a distance of 6,200 feet from the shotpoint. Using Formula (9), dt for these two arrays turns out to be 2.49 and 2.52 milliseconds, respectively, assuming time t equals 1.000 second. The desired 2.49 milliseconds differential delay per channel for the array corresponding to line 316 produces the same pattern of relative delays for line 316 as for the array of line 314. However, the array represented by line 318 has a sufficiently greater difference in delay between channels so that the fourth element of the array is selected from the memory slot corresponding to a time t equal to 1.008 seconds instead of 1.007 seconds as in the case of arrays corresponding to lines 314 and 316. Similarly, the sixth and eighth samples are taken at times of 1.013 and 1.018 seconds, respectively, instead of at 1.012 and 1.017 seconds, respectively, for the arrays corresponding to lines 314 and 316. This increase in the required delay between samples which are being combined to produce in-phase summation, would of course be expected in the case of arrays more remote from the shotpoint, and with increased angularity of the incident seismic waves. More generally, for each array along the length of the cable the stored seismic samples may be selected in accordance with Formula (9).

Of course, with reference to FIG. 13, arrays involving the first few sensor units closest to the shotpoint would be receiving signals very nearly perpendicular to the cable and therefore would not require much delay between channels being combined. On the other hand, for the final array near the end of the cable, the incoming reflections would be at a more shallow angle than those at the center of the cable and will therefore require significantly more delay between adjacent channels, as the signal information is being combined. In addition, the required delays between channels will change with time, and will be reduced with increasing time, as reflections come from progressively deeper geologic interfaces at more nearly vertical incidence on the arrays. From a mathematical standpoint, the arrays may be expressed in terms of equations of the following form:

$$Y_t^J = C_{i,J} \cdot Y_{(t+mz)}^K \quad (11)$$

$$Y_{1.000}^J = C_{1,J} \cdot Y_{1.00}^{251} + C_{2,J} \cdot Y_{1.002}^{252} + C_{8,J} \cdot Y_{1.017}^{258} \quad (12)$$

where $Y_t^J$ is an array sample from the $J^{th}$ array output at time t, $Y_{(t+mz)}^K$ is a sample from the $K^{th}$ input channel at time t, with t increasing by the slope z multiplied by the sample number m, and $C_{i,J}$ is the $i^{th}$ coefficient applied to an input channel for the $J^{th}$ array output. Equation (11) above is limited to short arrays, such as the eight-element arrays indicated by lines 314, 316, and 318 in FIG. 13, an equation (11) assumes that the slope z is constant, and this assumption is only valid for short arrays.

In the example of the computer implementation of equations (11), (12), note that the successive array signal outputs are a combination of signals from eight adjacent sensor units taken at different discrete sampling intervals selected to approximate the slope of the delay versus distance of the arriving seismic wave. In the present instance, this slope was 2.45 milliseconds for the 20-foot sensor unit spacing; accordingly, the selected samples were spaced apart by either two or three milliseconds.

It may also be noted that, for the ten sensor unit array of FIG. 5, the ten coefficients would be 1, 2, 3, 4, 5, 5, 4, 3, 2, 1. Thus, for example, for the eighth of the ten samples to be included in an array as shown in FIG. 5, $C_{8,J} = 3$.

Alternatively, and for other surveys, a uniform weighting could be applied to all samples. In addition, of course, a greater or lesser number of channels may be employed in the formation of array signals; however, it is contemplated that from eight to thirty-two sensor units will normally be included in each array. The present invention provides the additional capability of processing data using arrays steered toward the expected direction of arrival of seismic signals, and then reprocessing the data to steer the arrays in modified directions tailored to the special geologic conditions to provide a better "look" at the terrain under survey, without the need for additional field work.

In connection with marine systems, as noted above, the seismic impulse is normally initiated on the ship, as the cable is being towed behind it. Accordingly, the beam steerer forms the arrays so that their direction of maximum reception is toward the ship and down, and pointing increasingly further down with increasing time as seismic reflections are returning from deeper geological boundaries. Similarly, in connection with land surveys, where the seismic impulses may originate at either end of the seismic cable, or near the middle, the arrays are again directed initially toward the expected points of reflection of the seismic impulse from horizontal geological boundaries. It may also be noted, with regard to normal moveout correction, that this may be accomplished, if desired within the beam steerer 184 instead of in processor 192. This is accomplished, with reference to FIGS. 12 and 13, by selecting seismic array samples from memory 254 which are displaced in time as a group from the samples included in adjacent arrays. In FIG. 13, this would correspond, in a qualitative way, to shifting line 316 down or later in time in field 254', thus displacing the corresponding array in time, so that the array signals from the arrays represented by lines 314 and 316 would, at any instant of time, both represent reflections from the same depth. Of course, memory 254 would have to be increased in capacity to accommodate the large delays required. In this way normal moveout correction in addition to array formation, may be accomplished in beam steerer 184.

It may also be noted that the present system may be used with any seismic impulse source, explosives, air guns, or swept frequency vibrators, for specific examples. Of course, in the case of signals received from a swept frequency vibrator source, prior to processing in beam steerer 184, the received signals would be correlated and transformed to impulse response form, for each of the 500 sensor unit locations or channels.

In closing, it is emphasized that the foregoing description represents the preferred embodiment of the invention, and various alternative circuits or structures may be included or substituted for some of the individual circuits and structures disclosed herein without departing from the spirit of the invention. Thus, for example, other techniques for multiplexing signals from the individual transceiver units may be employed. Similarly, various alternative special circuits may be employed to implement the beam steering and array forming arrangements as described herein.

What is claimed is:

1. In a seismic exploration system for processing reflected seismic signals, including an elongated seismic cable having a plurality of elemental seismic sensor units connected to and located at intervals along the greater part of the length of said cable, each elemental seismic sensor unit including a lesser plurality of electrically inter-connected seismic sensors, the improvements comprising:

means for selecting sets of elemental seismic sensor units from which array signals are to be formed;

means for selecting the relative delays required to be applied to seismic signals from the sensors in each set to substantially eliminate differential moveout between the seismic signals within each set;

means for establishing a time window having a predetermined width;

a matrix storage means for receiving signals from all of said plurality of elemental seismic sensor units during said time window;

means for storing said signals in a first dimension of said matrix as a function of seismic sensor-unit location and in a second dimension as a function of a desired reflection time increment;

means for extracting from said matrix storage, signals that originate from different seismic sensor units and that are relatively displaced in time by said selected relative time delays;

means for combining said so-extracted signals to form the array signals; and means for incrementally shifting said time window as a function of reflection travel time.

2. The improvement as defined by claim 1 wherein the signals from some of the elemental sensor units are common to more than one array signal.

3. The improvement as defined in claim 1 including:

means for weighting the seismic sensor unit signals before said signals are combined to form said array signals, the signals from seismic sensor units that are common to more than one array signal being differently weighted with respect to said array signals.

4. The improvement as defined in claim 1 wherein the function defining said relative time delays is different for different array signals.

5. The improvement as defined in claim 1, including:

controller means for defining array signal parameters including relative time delays, weighting coefficients, and the number of elemental seismic sensor units to be contained within those sets of such units that are to be employed in forming each array signal, so that desired seismic sensor array configurations can be established without physically changing the seismic cable in the field.

6. A method for processing seismic data, comprising the steps of:

collecting the time-varying seismic detector output signals from a plurality of seismic sensors positioned in a cable;

selecting a series of signal values from each sensor at fixed time intervals apart during a predetermined time window;

storing the series in a two dimensional matrix memory, one dimension representing the sensor position and the other dimension representing the time intervals;

calculating the desired relative time delay relationship among the sensors that are selected to form a desired array to substantially eliminate moveout between the sensors of that array;

determining the time-dimension address for each said selected sensor that corresponds to the relative desired time delay relationship;

forming the array by selecting the output signal value for each sensor according to the determined time-dimension address, and;

summing the selected output signal values to form a composite signal so that the composite signal has the signal to noise ratio benefits of an array of sensors and the high frequency response of a single sensor.

7. The method of claim 6 including the additional steps of:

selecting the values of a desired weighting relationship among the sensors of an array to be formed;

determining the sensor position-dimension address corresponding to the respective weighting values; and multiplying the signal output values that are selected when the array is formed by the corresponding weighting value according to the determined sensor position-dimension address before summing.

8. The method of claim 6 including the additional step of:

updating the matrix memory by incrementally shifting the time window with respect to the time dimension of the memory.

9. The method of claim 6 including the additional step of:

forming additional overlapping arrays, each including signals from at least one channel common to at least two of said overlapping arrays, said included signals being differently weighted with respect to each said additional array.

10. An improved method for producing seismic records of the type in which the outputs from a plurality of sensors are selected in groups to form group array signals, wherein the improvement comprises the steps of:

(a) receiving and storing the instantaneous values of the outputs from each sensor in a group at fixed time intervals;

(b) calculating a desired amount of time displacement for each sensor in the group relative to the other sensors in that group as a function of reflection time and sensor position;

(c) determining the multiple of the time interval most closely corresponding to each time interval most closely corresponding to each said time displacement for each sensor;

(d) selecting the sensor outputs stored at the determined time-interval multiples;

(e) summing the selected outputs to form the group array signals;

(f) recording said outputs on an archival storage medium;

(g) utilizing said group array signals to produce displays of seismic data depicting the characteristics of subsurface geologic formations.

11. An improved seismic exploration system of the type having an elongate seismic cable including a plurality of seismic sensors at intervals therealong for receiving reflected seismic signals, wherein the improvement comprises:

(a) means for selecting a subset of the sensors from which a group signal is to be formed;

(b) means for establishing a time window having a predetermined width;

(c) matrix storage means for receiving signals from the subset during the time window;

(d) means for storing the signals in a first dimension of the matrix as a function of sensor location and in a second dimension as a function of time;

(e) means for extracting signals from the matrix storage associated with different sensor locations and displaced in time with respect to each other by delays selected to substantially eliminate the effects of moveout between the sensors within the subset; and (f) means for combining the extracted signals to form the group signal.

12. The system of claim 11, further comprisisng:

(g) means for selecting a second subset of the sensors from which a second group signal is to be formed, some of the sensors being common to both subsets.

13. The system of claim 12, further comprising:

(h) means for weighting the signals from the sensors within each subset before they are combined, the signals from sensors common to both subsets being weighted differently in each subset.

14. The system of claim 13, further comprising:

(i) means for altering the selection of sensors in each subset to alter the group configurations without physically changing the cable in the field.

15. An improved seismic exploration system of the type having an elongate seismic cable including a plurality of sensors therealong for receiving reflected seismic signals, wherein the improvement comprises:

(a) means for selecting a subset of sensors from which a group signal is to be formed;

(b) means for determining the relative time delays required between the signals of the sensor in the subset as a function of reflection time to substantially eliminate the effects of moveout therebetween; and (c) means for combining the signals in accordance with the determined delays to form a seismic trace.

16. The improved seismic exploration system of claim 15, wherein the time delay determining means includes:

(d) means for determining the differential time delays required between the signals of the sensors in the subset to substantially eliminate the effects of a selected dip moveout therebetween.

17. A method for processing seismic data to provide the improved signal-to-noise ratio characteristics of an elongated array whilst retaining the high frequency resolution of a single sensor, including collecting time-distributed seismic signals, sampled at fixed sample intervals, generated by a plurality of spatially-distributed seismic sensors in response to impinging seismic waves, comprising the steps of:

(a) ordering the signal samples, collected during a time window having a predetermined width, into a desired format in accordance with the spatial distribution of the seismic sensors and the time distribution of the sampled seismic signals;

(b) designating subpluralities of seismic sensors as members of desired seismic sensor arrays;

(c) determining, as an integral multiple of said sample interval, a time correction for time misalignments of the generated signals due to travel-path angularity of said seismic waves impinging upon the respective designated sensors of each said array;

(d) for each seismic sensor designated as a member of an array, identified according to its spatial distribution, selecting a seismic signal sample according to its time distribution as determined by said time correction; and (e) for each said array, combining said selected signal samples to form composite array signals.

18. The method for processing seismic data as defined by claim 17, comprising the further step of:

(f) scrolling said time window as a function of reflection travel time by a preselected multiple of said sample interval; and repeating steps (a) through (f).

19. The method for processing seismic data as defined in claim 17, further comprising the steps of:

recording the collected seismic signal samples on an archival storage medium and substantially concurrently formatting said composite array signals into a seismic trace.

20. The method for processing seismic data as defined by claim 19, further comprising the steps of:

defining certain designated seismic sensors as members common to more than one array;

weighting the seismic signal samples from designated seismic sensors before said signal samples are combined to form composite array signals, the signal samples from seismic sensors that are common to more than one array being differently weighted with respect to said different arrays.

21. A method for producing improved recordings of seismic signals collected from a plurality of spatially-distributed seismic sensors that are selectably subdivided into sensor groups, each of which includes a desired number of members, the method comprising the steps of:

(a) sampling the seismic signals collected from said seismic sensors at fixed sample intervals during a time frame having a fixed length equal to a predetermined multiple of said sample interval;

(b) storing said samples as a function of the spatial distribution of said seismic sensors and the sample-interval multiple of each said sample;

(c) calculating the differential time displacements for each member of the selected sensor groups relative to the other members of those groups as a function of reflection travel time, the spatial distribution of the sensors, and an arbitrary velocity function;

(d) determining the multiple of the sample interval that most closely approximates the calculated time displacements;

(e) for each selected sensor group, extracting the samples stored at the determined sample-interval multiples corresponding to the members of each group;

(f) combining the extracted samples from the members of each sensor group to form a group signal;

(g) recording said group signals as a visual seismogram; and (h) substantially concurrently, archivally recording the seismic signal samples collected from said plurality of seismic sensors.

22. The method of claim 21 wherein a plurality of group signals are formed and different portions of the outputs of a single sensor are selected for more than one group signal.

23. The method of producing improved seismic signal recordings according to claim 21, comprising:

defining the length of the fixed-length time frame as an integral multiple of the sample rate that is at least equal to the largest expected time displacement between the members of the sensor groups.

24. The method of producing improved seismic recordings according to claim 23, comprising:

repeatedly scrolling the fixed-length time frame by a desired integral multiple of the sample rate; and repeating steps (a) through (h).

25. The method of producing improved seismic recordings according to claim 24, comprising:

designating at least one member of each group as a member common to at least one other different group so that signal samples from that sensor are shared with said different group;

weighting the extracted signal samples corresponding to the members of each group prior to the combination thereof, the signal samples from sensors that are common to more than one group being differently weighted with respect to the different groups.

26. The method of producing improved seismic signal recordings according to claim 25, comprising:

calculating said differential time displacements additionally as a function of an arbitrary dip angle of selected reflecting horizons.

* * * * *

UNITED STATES PATENT AND TRADEMARK OFFICE
CERTIFICATE OF CORRECTION

PATENT NO. : 4,319,347
DATED : March 9, 1982
INVENTOR(S) : Carl H. Savit

It is certified that error appears in the above—identified patent and that said Letters Patent are hereby corrected as shown below:

Col. 14, line 38 change "1,000" to ---1.000---.

Col. 14, line 50, change "1,000" to ---1.000---.

Col. 14, Equation 9, change "6.000" to ---6,000---.

change "7.000" to ---7,000---.

Signed and Sealed this

Nineteenth Day of June 1984

[SEAL]

Attest:

Attesting Officer

GERALD J. MOSSINGHOFF

Commissioner of Patents and Trademarks